US006476488B1

(12) United States Patent
Jeng et al.

(10) Patent No.: US 6,476,488 B1
(45) Date of Patent: Nov. 5, 2002

(54) METHOD FOR FABRICATING BORDERLESS AND SELF-ALIGNED POLYSILICON AND METAL CONTACT LANDING PLUGS FOR MULTILEVEL INTERCONNECTIONS

(75) Inventors: Erik S. Jeng, Hsinchu (TW); Bi-Ling Chen, Taipei (TW); Chien-Sheng Hsieh, Taipei (TW)

(73) Assignee: Vanguard International Semiconductor Corp., Hsin-Chu (TW)

( * ) Notice: Subject to any disclaimer, the term of this patent is extended or adjusted under 35 U.S.C. 154(b) by 0 days.

(21) Appl. No.: 09/696,086

(22) Filed: Oct. 26, 2000

Related U.S. Application Data (62) Division of application No. 09/247,977, filed on Feb. 11, 1999, now Pat. No. 6,159,839.

(51) Int. Cl.[7] .......................... H01L 23/48; H01L 21/44
(52) U.S. Cl. ...................... 257/751; 257/763; 257/767; 438/597; 438/598; 438/618
(58) Field of Search ............................... 257/763, 767, 257/750, 296, 751, 753, 306, 307, 308; 438/597, 598, 618, 621, 622, 637

(56) References Cited

U.S. PATENT DOCUMENTS

| | | | |
|---|---|---|---|
| 4,966,870 A | 10/1990 | Barber et al. ............... | 437/228 |
| 5,654,589 A | 8/1997 | Huang et al. ............... | 257/763 |
| 5,665,623 A | 9/1997 | Liang et al. ................ | 438/239 |
| 5,674,781 A | 10/1997 | Huang et al. ............... | 437/192 |
| 6,001,683 A | * 12/1999 | Lee .............................. | 438/241 |
| 6,144,096 A | * 11/2000 | Lopatin ....................... | 257/751 |
| 6,255,151 B1 | * 7/2001 | Fukuda et al. .............. | 438/197 |

* cited by examiner

Primary Examiner—Steven Loke
Assistant Examiner—Donghee Kang
(74) Attorney, Agent, or Firm—George O. Saile; Stephen B. Ackerman (57) ABSTRACT

A method for making a novel structure having borderless and self-aligned polysilicon and metal contact landing plugs for multilevel interconnections on integrated circuits is achieved. An etch-stop layer and a planar insulating layer are formed over the devices on a substrate. Contact openings are etched in the insulating layer to the etch-stop layer and the etch-stop layer is removed over the $N^-$ contact areas. An $N^+$ doped polysilicon layer is deposited, and second contact openings are etched in the polysilicon and insulating layers over $N^+$ and $P^+$ contacts on the substrate to the etch-stop layer. The etch-stop layer is selectively removed and a conducting barrier layer and a metal layer are deposited having a second etch-stop layer on the surface. The layers are patterned to form interconnecting lines and concurrently to form polysilicon landing plugs to the $N^-$ contacts, while forming metal landing plugs to the $N^+$ and $P^+$ contacts. Via holes can now be etched in a second insulating layer over and to the landing plugs. The polysilicon landing plugs to the $N^-$ contacts reduce current leakage, while the metal contacts to the $N^+$ and $P^+$ contacts reduce the contact resistance (Rc). The landing plugs protect the substrate contacts from damage during via hole etch and reduce the aspect ratio for making more reliable contacts.

5 Claims, 5 Drawing Sheets

METHOD FOR FABRICATING BORDERLESS AND SELF-ALIGNED POLYSILICON AND METAL CONTACT LANDING PLUGS FOR MULTILEVEL INTERCONNECTIONS

This is a division of patent application Ser. No. 09/247,977, filing date Feb. 11, 1999, now U.S. Pat No. 6,159,839, A Method For Fabricating Borderless And Self-Aligned Polysilicon And Metal Contact Landing Plugs For Multilevel Interconnections, assigned to the same assignee as the present invention.

BACKGROUND OF THE INVENTION (1) Field of the Invention

This invention relates to integrated circuit semiconductor devices, and more particularly to a method for fabricating multilevel interconnections having self-aligned and borderless polysilicon and metal landing plug contacts for integrated circuits. The method is particularly useful for making polysilicon N doped landing plugs for low current leakage to $N^-$ contacts on the substrate, while concurrently making metal contacts to $N^+$ and $P^+$ contacts on the substrate for low contact resistance.

(2) Description of the Prior Art

Ultra Large Scale Integrated (ULSI) circuits fabricated on semiconductor substrates require multilevels of metal interconnections to electrically interconnect the discrete semiconductor devices on the semiconductor chips. In the conventional method, the different levels of metal interconnections are separated by layers of insulating material. These interposed insulating layers have etched contact holes and via holes which are used to electrically connect the metal layers to the underlying semiconductor substrate and to other underlying patterned conducting layers, such as doped polysilicon, polycide (polysilicon/silicide) layers, and the like.

However, in future generations of integrated circuits, as the minimum feature sizes of semiconductor devices decrease (for example, minimum feature sizes of 0.25 um or less) the lines/spacings shrink. This results in aspect ratios (height/width) of the contact holes or via holes increasing dramatically. Therefore, the contact openings to different underlying $N^-$, $N^+$, and $P^+$ contacts on the substrate and to tungsten silicide and/or tungsten lines are difficult to make because of the contact opening high aspect ratio. This makes it difficult to etch reliable contact holes to the substrate without damaging the substrate.

Figure 1:
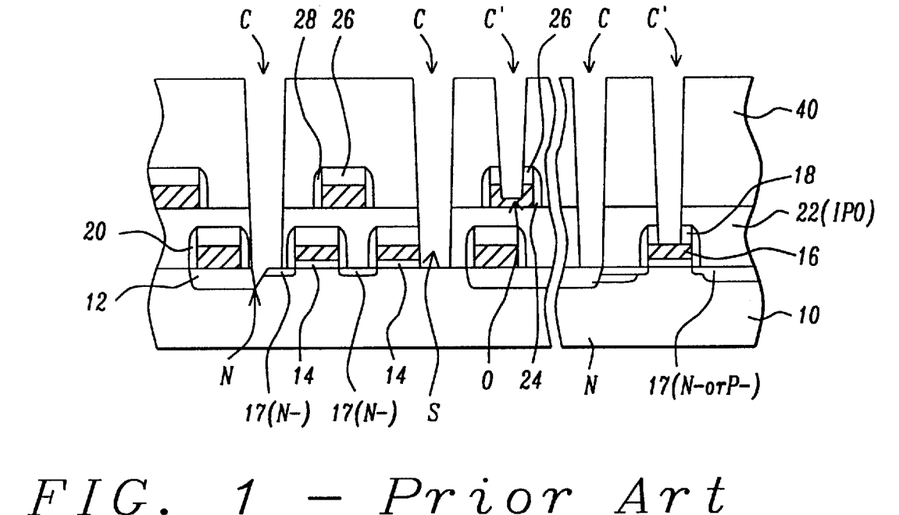
FIG. 1 is a schematic cross-sectional view depicting a multilevel interconnect structure by the prior art, and shows contact erosion of the $N^-$ contacts on the substrate and etching of the FET gate electrode that result in reliability problems.

To better appreciate this problem, FIG. 1 shows a schematic cross-sectional view of a partially completed integrated circuit on a semiconductor substrate having the conventional contact openings by the prior art. The cross section shows a substrate 10 having field effect transistors (FETs) with gate electrodes 16 with a cap oxide 18 and sidewall spacers 20, and a gate oxide 14. Lightly doped source/drain areas 17($N^-$) are formed adjacent to the gate electrodes on some of the FETs in device areas of a first type, for low current leakage contacts, while $N^+$ and $P^+$ contacts 19($N^+$ or $P^+$) are formed in device areas of a second type for low contact resistance (Rc), such as for CMOS circuits. A planar first insulating layer or an inter-polysilicon oxide (IPO) layer 20 is used to insulate the FETs and on which the next level of electrically conducting lines 24, such as tungsten silicide or tungsten, are formed having a cap oxide layer 26 and sidewall spacers 28. A second insulating layer 40 is deposited to insulate the electrically conducting lines 24, and is planarized. Electrical connections are then made by etching high-aspect-ratio contact openings C to the substrate 10, to the FET gate electrodes 16, and to the next level of inter-connections 24. When these contacts are etched to the shallow $N^-$ contacts on the substrate, it is difficult to avoid overetching (notching) of the substrate and destroying the $N^-$, $N^+$, and $P^+$ contact-to-substrate junctions, as depicted by the points N in FIG. 1. Also, for these closely spaced gate electrodes 16, it is difficult to etch the contact C to the substrate without etching into the polysilicon gate electrode, resulting in electrical shorts as depicted by the point S in FIG. 1. Also, in etching contacts C to the substrate, it is difficult to avoid overetching the contacts C' to the next level of inter-connecting lines 24, as depicted by the point O in FIG. 1.

Several methods of making high-aspect-ratio borderless contacts are reported in the literature. One method for making borderless contacts is described in U.S. Pat. No. 4,966,870 to Barber et al., in which a silicon nitride etch-stop layer is used on the substrate when the borderless contact is etched in an overlying silicon oxide layer. Other methods for making high-aspect-ratio borderless contacts in insulators are described by Liang et al., U.S. Pat. No. 5,665,623, in which borderless contacts are made to source/drain areas that are less than the minimum feature size of the current photolithographic resolution utilizing the lateral oxidation resulting from the field oxide when the local oxidation of silicon (LOCOS) is used. Huang et al., U.S. Pat. Nos. 5,674,781 and 5,654,589, describe a method and structure in which a titanium/titanium nitride (Ti/TiN) layer is used to make a Ti/TiN stacked interconnect structure to form local inter-connects and contact landing pads on the same level.

Therefore there is still a need in the industry to provide a simpler method for making improved landing plugs for multilevel interconnect structures, which reduces the aspect ratios of contact openings and prevents substrate damage.

SUMMARY OF THE INVENTION

It is a principal object of the present invention to make polysilicon and metal contact landing plugs with self-aligned borderless contacts for multilevel interconnections on integrated circuits.

It is another object of the present invention to concurrently make metal/polysilicon interconnecting lines during formation of the polysilicon/metal contact landing plugs, thereby simplifying the manufacturing process steps.

Still another object of this invention is to form $N^+$ polysilicon contacts to $N^-$ doped substrate contacts, and concurrently to form metal contacts to $N^+$ and $P^+$ doped regions to provide improved (low) contact resistance (Rc).

It is another object of this invention to utilize the polysilicon and metal contact landing plugs to etch contact openings with reduced aspect ratio.

Yet another objective of this invention is to use the process for making these polysilicon/metal plug landing contacts to make improved dynamic random access memory (DRAM) circuits.

This invention describes a method for making polysilicon and metal landing plugs as borderless and self-aligned contacts for multilevel interconnections. The method provides a means for forming $N^+$ doped polysilicon plugs to $N^-$ doped substrate contacts for low leakage currents, as is typically desired for capacitor node contacts on DRAM device, while providing metal contacts to $N^+$ and $P^+$ doped contacts on the substrate for low contact resistance (Rc), such as in the peripheral areas of the DRAM chips for CMOS circuits.

The method begins by providing a semiconductor substrate having first and second device areas wherein the first device areas require $N^+$ polysilicon contacts to $N^-$ substrate contacts, while the second device areas require metal contacts to the heavily doped $N^+$ and $P^+$ contacts on the substrate. Typically the substrate is a single-crystal silicon having a <100> crystallographic orientation and includes N and P wells for making P-channel and N-channel FETs having these $P^+$ and $N^+$ contacts, respectively. A relatively thick Field OXide (FOX) is formed that surrounds and electrically isolates the device areas in and on the substrate. One conventional method of forming the field oxide areas is by shallow trench isolation (STI), as commonly practiced in the industry. The FETs are formed next by growing a thin gate oxide by thermal oxidation on the device areas. An $N^+$ doped polysilicon layer and a refractory metal silicide layer are deposited to form a polycide layer. A cap oxide composed of silicon oxide/silicon nitride is deposited on the polycide layer, and the multilayer is then patterned to form the gate electrodes having this cap oxide. Lightly doped source/drain (LDD) areas are implanted adjacent to the gate electrodes to improve the device characteristics (minimize short-channel effects). Borderless polysilicon and metal landing plug contacts are now formed self-aligned to the gate electrodes. A conformal first silicon nitride ($Si_3N_4$) layer is deposited and partially etched back to form sidewall spacers on the gate electrodes and to protect the device areas. The $N^+$ and $P^+$ contact regions in the second device areas are formed by using photoresist ion implant block-out masks and implanting arsenic (As) or phosphorus (P) ions for the $N^+$ contacts, and implanting boron (B) ions for the $P^+$ contacts. A first insulating layer, preferably composed of silicon oxide ($SiO_2$), is deposited by low-pressure chemical vapor deposition (LPCVD), and is planarized, for example by chemical/mechanical polishing (CMP). A first photoresist mask and anisotropic plasma etching are used to selectively etch first contact openings in the first device areas. The first contact openings are etched in the first insulating layer to the first $Si_3N_4$ layer in the first device areas for the polysilicon landing plugs, and are self-aligned to the FET gate electrodes. The first $Si_3N_4$ layer is then removed in the first contact openings to expose the $N^-$ contacts on the substrate. After removing the first photoresist mask, an $N^+$ doped polysilicon layer is deposited on the substrate contacting the $N^-$ source/drain contact areas. A second photoresist mask and anisotropic etching are used to selectively etch second openings in the polysilicon layer and the first insulating layer to the gate electrodes, and to partially etch in the first insulating layer over the $N^+$ and the $P^+$ contact regions in the second device areas on the substrate. The remaining portion of the $SiO_2$ first insulating layer in the second openings over the $N^+$ and $P^+$ contacts is then selectively etched to the first $Si_3N_4$. The first $Si_3N_4$ layer is then selectively etched in the second openings to expose the $N^+$ and $P^+$ contacts on the substrate. A titanium/titanium nitride first barrier layer is deposited on the $N^+$ polysilicon layer and in the second contact openings making electrical contact to the $N^+$ and $P^+$ contacts in the second device areas. A first tungsten metal layer is deposited on the first barrier layer and is sufficiently thick to fill the first and second openings. The tungsten is also deposited to a thickness sufficient to provide an essentially planar surface. A second $Si_3N_4$ layer is deposited. The second $Si_3N_4$ layer, the first tungsten metal layer, the first barrier layer, and the polysilicon layer are patterned to form local interconnecting lines. Concurrently during patterning, $N^+$ doped polysilicon landing plugs are formed in the first device areas and tungsten metal landing plugs are formed to the $N^+$ and $P^+$ contact regions in the second device areas. A third $Si_3N_4$ layer is deposited and etched back to form sidewall spacers on the local interconnecting lines. A CVD $SiO_2$ second insulating layer is deposited and planarized by CMP. Multilevel contact holes (via holes) are etched in the second insulating layer to the polysilicon landing plugs, to the tungsten metal landing plugs, and to the interconnecting lines. The self-aligned landing plugs prevent overetching the contacts in the substrate and etching into the gate electrodes as commonly occurs in the prior art. Also, the self-aligned landing plugs reduce the aspect ratio for the via holes, thereby making it easier to etch submicron-wide via holes. The process up to the first metal is now completed by depositing a titanium/titanium nitride second barrier layer and a second tungsten metal layer. The tungsten metal layer and the second barrier layer are blanket etched back to form metal plugs in the via holes to the polysilicon landing plugs and to the tungsten landing plugs. A conducting metal multilayer, preferably composed of a titanium-titanium nitride/aluminum copper/titanium nitride (Ti—TiN/AlCu/TiN), is deposited and patterned to complete the integrated circuits up to a first level of metal interconnections.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

Referring now to FIGS. 2 through 12 and in keeping with the objects of this invention, a detailed embodiment is described for fabricating polysilicon and metal contact landing plugs for multilevel interconnections on integrated circuits. The method forms the polysilicon landing plugs and the metal landing plugs concurrently while also forming the local interconnecting lines. The $N^+$ polysilicon plugs form good ohmic contacts to $N^-$ doped regions on the substrate with low leakage current, while the metal plugs form contacts having low contact resistance to the $N^+$ and $P^+$ contacts elsewhere on the substrate. The landing plugs also prevent overetching the substrate and reduce aspect ratios for etching contact openings. Although the process is described for making improved landing plugs for multilevel interconnections in general, it should also be well understood by those skilled in the art that the method is particularly useful for making polysilicon plug contacts for stacked capacitors on DRAM circuits, while the metal plug contacts provide low Rc contacts in the peripheral areas of the DRAM chip. The $N^+$ polysilicon plugs are formed to the $N^-$ source/drain contact areas in the memory cell area to reduce leakage current, while the metal contact landing plugs to the $P^+$ and $N^+$ contacts in the peripheral area for N-channel and P-channel FETs (CMOS) in the peripheral area of the DRAM chip reduce the contact resistance (Rc) and improve circuit performance.

Figure 2:
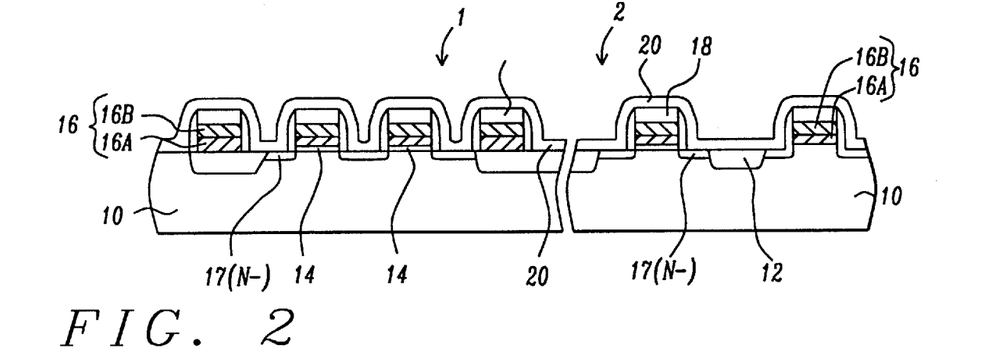
FIGS. 2 through 12 are schematic cross-sectional views showing the sequence of process steps for making the improved multilevel interconnections by using the borderless self-aligned polysilicon and metal contact landing plugs that prevent the reliability problems of the prior art.

Referring to FIG. 2, the method begins by providing a semiconductor substrate 10, a portion of which is shown in the FIG. 2. The substrate is typically a single-crystal silicon having a <100> crystallographic orientation and includes N and P wells for making P-channel and N-channel FETs. For this invention, the substrate 10 has device areas of a first type 1 in which N doped polysilicon contacts to N⁻ contacts on the substrate are desired, and device areas of a second type 2 in which metal contacts to N⁺ and P⁺ contacts on the substrate are desired. The first and second device types can be interspersed on each chip on the substrate. For example, for DRAM circuits the first device type 1 would be memory cell areas having N⁻ contacts on the chip, while the second device type 2 would be the peripheral circuits having P⁺ and N⁺ contacts on the chip. The device areas are surrounded and electrically isolated from each other by a relatively thick Field OXide (FOX) 12. For high-density circuits, one conventional method of forming the field oxide areas is by shallow trench isolation (STI), as commonly practiced in the industry. These STI areas are generally formed by etching trenches in the silicon substrate 10, and filling the trenches with an insulating material such as $SiO_2$ 12 that is etched or polished back to be planar with the substrate surface. The FETs are formed next by growing a thin gate oxide 14, for example by thermally oxidizing the device areas. The gate oxide 14 is grown to a thickness of between about 40 and 80 Angstroms. An N⁺ doped polysilicon layer 16A and a refractory metal silicide layer 16B are deposited to form a polycide layer 16. Typically layer 16A is deposited by LPCVD using silane ($SiH_4$) as the reactant gas, and is doped with As or P to a concentration of between about 1.0 E 20 and 1.0 E 22 atoms/cm³. Layer 16A is deposited to a thickness of between about 500 and 1500 Angstroms. The silicide layer 16B is preferably tungsten silicide ($WSi_2$) and is deposited by CVD using, for example, tungsten hexafluoride ($WF_6$) and $SiH_4$ as the reactant gases, and the silicide is typically deposited to a thickness of between about 500 and 1500 Angstroms. A cap oxide layer 18 is formed by depositing a silicon oxide layer followed by a silicon nitride layer on the polycide layer 16. Layers 18, 16A, and 16B are then patterned to form the gate electrodes 16 having this cap oxide 18. Lightly doped source/drain (LDD) areas 17(N⁻) are implanted adjacent to the gate electrodes 16 in the device areas of the first type, while both N⁺ and P⁺ implants are used in the device areas of the second type using implant block-out masks to prevent implanting in areas where implant is not desired.

Continuing with FIG. 2, a conformal first silicon nitride ($Si_3N_4$) layer 20 is deposited over the gate electrodes 16 on the substrate. The $Si_3N_4$ is deposited preferably by LPCVD using a reactant gas such as dichloro-silane ($SiCl_2H_2$) and ammonia ($NH_3$), and is deposited to a thickness of between about 200 and 600 Angstroms.

Figure 3:
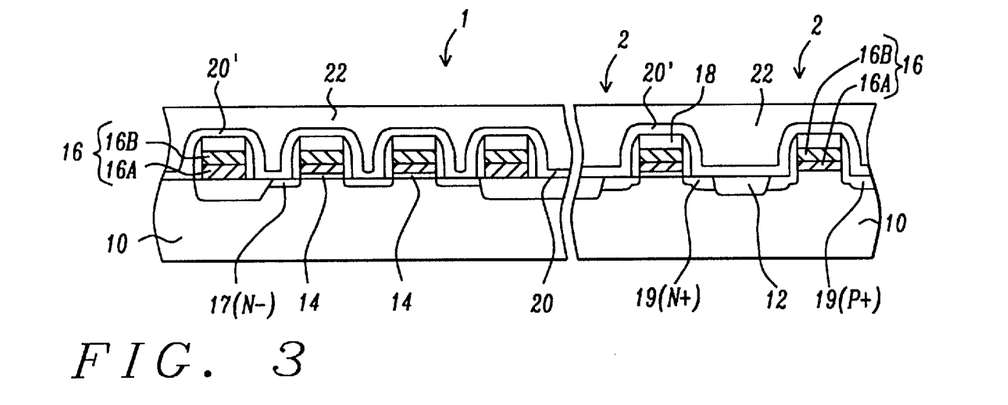

Referring to FIG. 3, the first $Si_3N_4$ layer 20 is partially etched back to form sidewall spacers 20' on the gate electrodes 16 leaving a portion 20 over the device areas to provide an etch-stop layer to protect the substrate from etching at a later processing step. The $Si_3N_4$ is etched back preferably by using a reactive ion etcher (RIE) and an etchant gas such as trifluoromethane/carbon tetrafluoride/ argon/oxygen ($CHF_3/CF_4/Ar/O_2$). The $Si_3N_4$ layer 20 is etched back to leave about 100 to 300 Angstroms on the substrate surface in the device areas. Continuing, the N⁺ and P⁺ contact regions are formed in the device areas of the second type 2 by using photo-resist ion implant block-out masks and implanting arsenic (As) or phosphorus (P) ions for the N⁺ contacts, and implanting boron (B) ions for the P⁺ contacts. Two of the heavily doped implant regions, 19(N⁺) and 19(P⁺), in the device areas of the second type 2 are depicted in FIG. 3. The preferred concentration after implanting is between about 1.0 e 19 and 1.0 E 21 atoms/cm³ for the N⁺ implant, and between about 1.0 E 19 and 1.0 E 21 atoms/cm³ for the P⁺ implant.

Still referring to FIG. 3, a first insulating layer 22, preferably composed of silicon oxide ($SiO_2$), is deposited by low-pressure chemical vapor deposition (LPCVD), using, for example, tetraethosiloxane (TEOS) as the reactant gas. Layer 22 is then planarized, for example by chemical/ mechanical polishing (CMP) to a thickness of between about 1000 and 3000 Angstroms over the FET gate electrodes 16.

Figure 4:
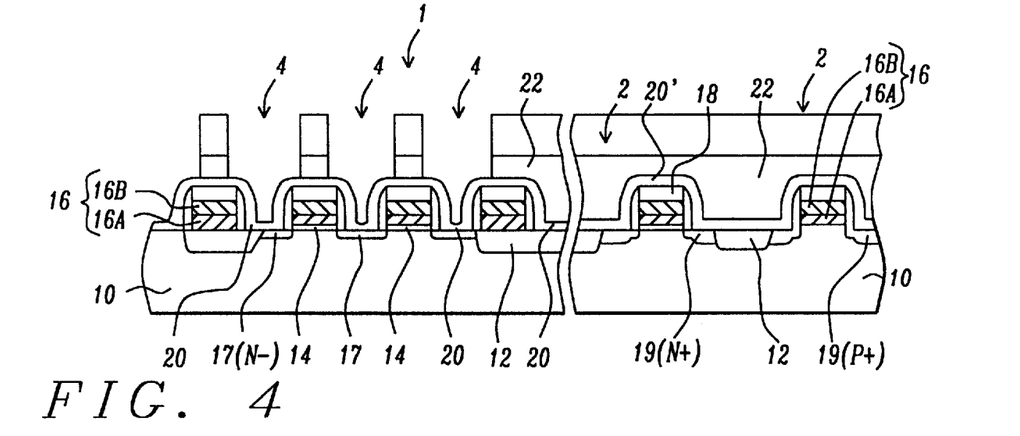

Referring to FIG. 4, a first photoresist mask 24 and anisotropic plasma etching are used to selectively etch self-aligned first contact openings 4 in the device areas of the first type 1, extending over the FET gate electrodes 16. The first contact openings 4 are etched in the $SiO_2$ first insulating layer 22 to the first $Si_3N_4$ layer 20 using an etchant that is highly selective to $Si_3N_4$. The etching is carried out preferably using an RIE and an etchant gas mixture such as $C_4F_8$, $C_5F_8$, CO, $O_2$, and Ar to provide an etch-rate selectivity of at least greater than 10:1. The first $Si_3N_4$ layer 20 is then removed in the first contact openings 4 to expose the N⁻ contacts 17(N⁻) on the substrate 10. The $Si_3N_4$ layer 20 is removed in situ in the same RIE chamber used to etch the openings 4 in the $SiO_2$ layer 22 using an etchant gas mixture such as $CHF_3$, $CH_3F$, $O_2$, and Ar that etches the $Si_3N_4$ selectively to the substrate 10.

Figure 5:
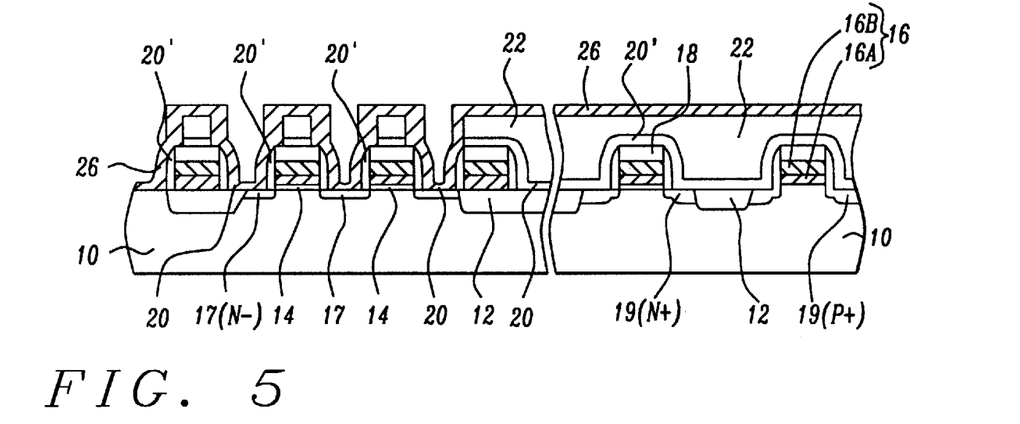

Referring to FIG. 5, after removing the first photoresist mask, an N⁺ doped polysilicon layer 26 is deposited on the substrate contacting the N⁻ source/drain contact areas 17(N⁺). The polysilicon layer 26 is preferably deposited by LPCVD using $SiH_4$ as the reactant gas, and is deposited to a thickness of between about 300 and 1000 Angstroms. Layer 26 is doped in situ during deposition by including a dopant gas such as phosphine ($PH_3$), and is doped to a preferred concentration of between about 1.0 E 19 and 1.0 E 21 atoms/cm³.

Figure 6:
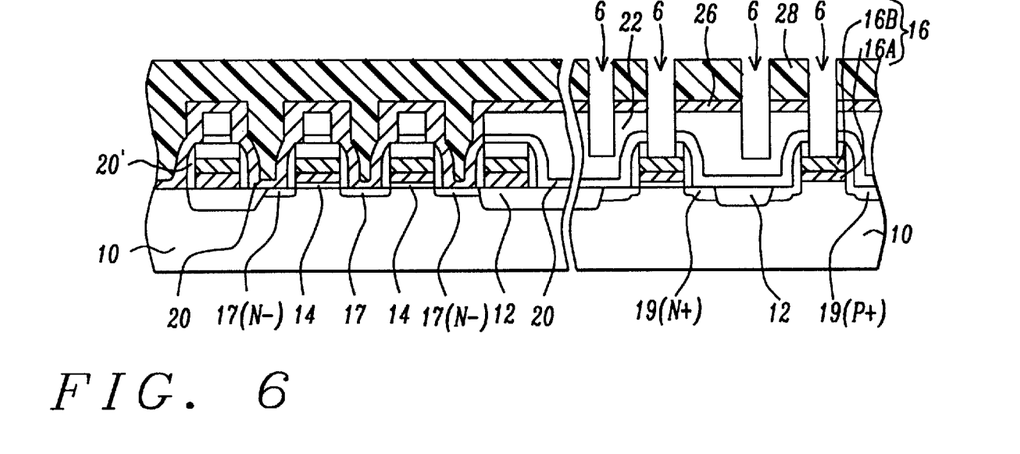

Referring to FIG. 6, a second photoresist mask 28 and anisotropic etching are used to selectively etch second openings 6 in the device areas of the second type 2. The openings 6 are etched in the polysilicon layer 26 and the first insulating layer 22 to the gate electrodes 16, and to partially etch in the first insulating layer 22 over the N⁺ and the P⁺ contact regions. The etching is depicted in FIG. 6 for etching to the contact areas 19(N⁺) and 19(P⁺) in the second device areas on the substrate for N-channel and P-channel FETs, respectively. The openings 6 are preferably etched using an RIE and an etchant gas such as $SF_6$, $CF_4$, $CHF_3$, $CH_3F$, $O_2$, and Ar for etching through the polysilicon layer 26, and an etchant gas such as $C_4F_8$, $CHF_3$, $CH_3F$, $O_2$, Ar for etching the $SiO_2$ selectively to the silicide layer 16B on the gate electrodes 16.

Figure 7:
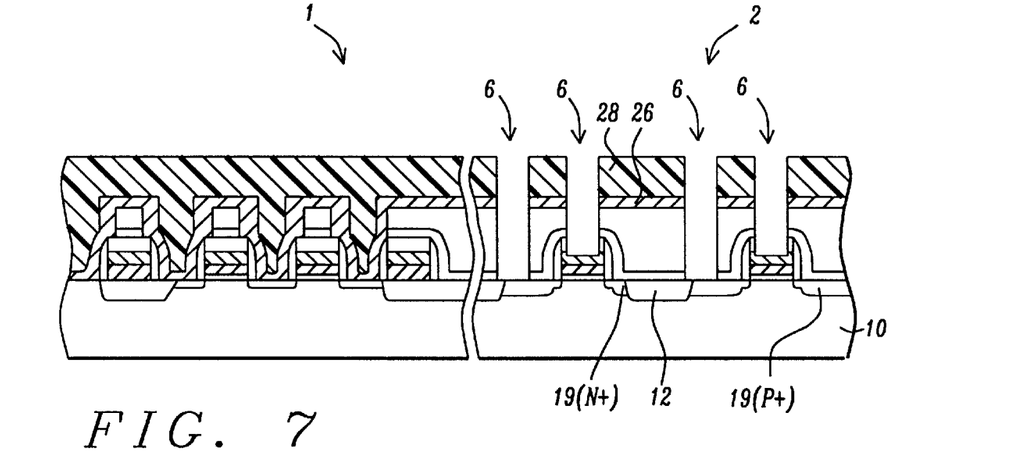

As shown now in FIG. 7, the remaining portion of the $SiO_2$ first insulating layer 22 in the second openings 6 over the N⁺ and P⁺ contacts is then selectively etched to the first $Si_3N_4$ layer 20. The etching is carried out preferably using an RIE and an etchant gas such as $C_4F_8$, $C_5F_8$, CO, $O_2$, and Ar that selectively etches the $SiO_2$ layer 22 to the $Si_3N_4$ layer 20. The first $Si_3N_4$ layer 20 exposed in the second openings 6 is then selectively etched to the N⁺ and P⁺ contacts, as depicted by 19(N⁺) and 19(P⁺) contacts for the N-channel and P-channel FETs.

Figure 8:
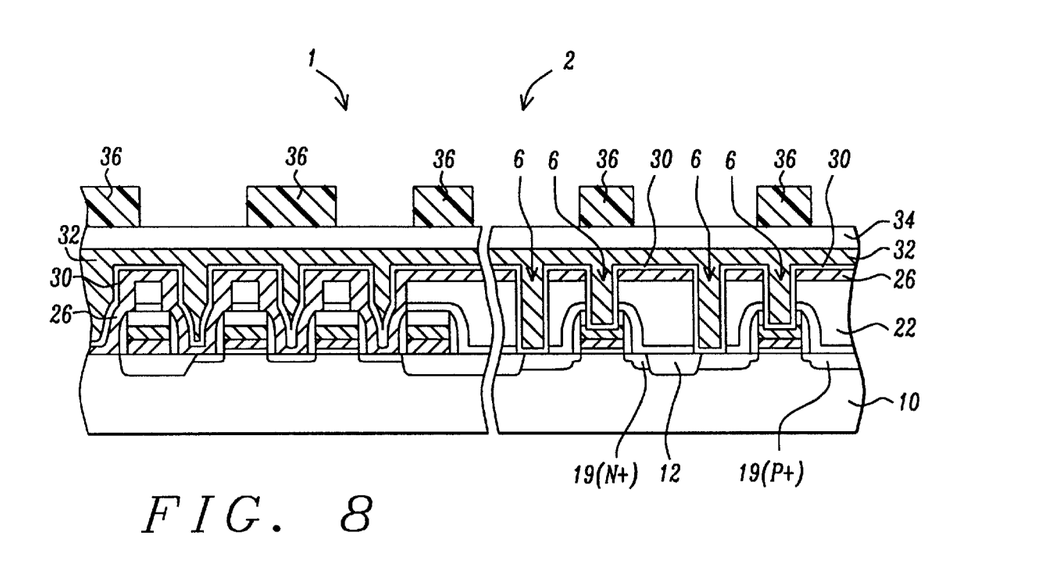

Referring to FIG. 8, after removing the photoresist 28, a first barrier layer 30, preferably composed of a titanium/ titanium nitride (Ti/TiN) layer is deposited on the N+ polysilicon layer 26 and in the second contact openings 6 and making electrical contact to the N+ and P+ contacts 19 in the device areas of the second type 2. Layer 30 is deposited, for example, by physical vapor deposition (PVD). The Ti is deposited first to a thickness of between about 50 and 300 Angstroms, and the TiN is, then deposited to a thickness of between about 50 and 300 Angstroms. A first tungsten (W) metal layer 32 is deposited on the first barrier layer 30 and is sufficiently thick to fill the first and second openings 4 and 6 and to provide an essentially planar surface. The W layer 32 is deposited by CVD using $WF_6$ as the reactant gas. Also as shown in FIG. 8, a second $Si_3N_4$ layer 34 is deposited on the W layer 32. Layer 34 is deposited by LPCVD or plasma-enhanced CVD and is deposited to a thickness of between about 1500 and 3000 Angstroms. A patterned photoresist mask 36 is then used as an etch mask to pattern the $Si_3N_4$ layer 34, the first W layer 32, the first barrier layer 30, and the polysilicon layer 26, as shown in FIG. 9.

Figure 9:
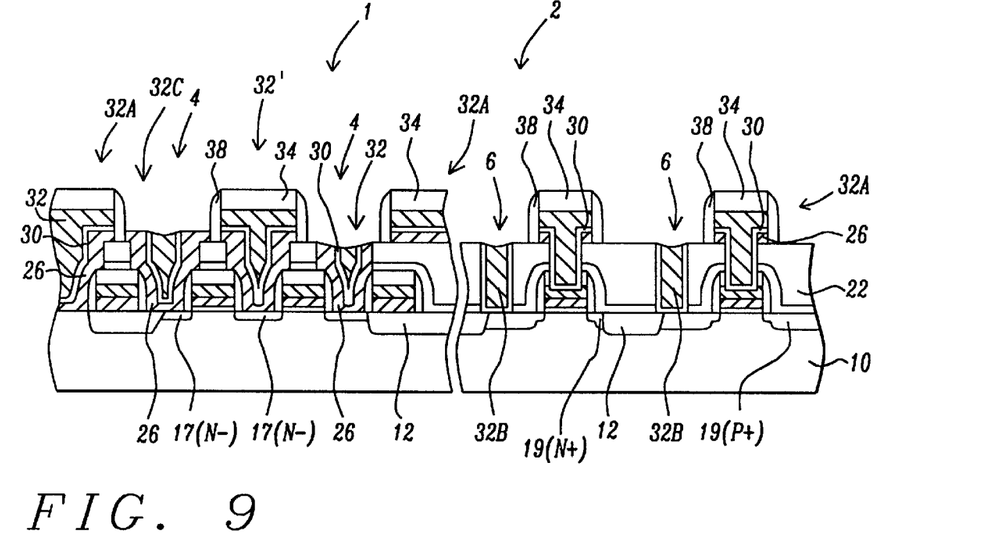

As shown in FIG. 9, anisotropic plasma etching is used to etch the multilayer composed of the second $Si_3N_4$ layer 34, the first tungsten metal layer 32, the first barrier layer 30, and the polysilicon layer 26 to form local interconnecting lines 32A. Concurrently during patterning, the metal is retained in the openings 6 to form metal plugs 32B in the device areas of the second type 2, while the N+ doped polysilicon 26 and portions of the tungsten layer 32 are retained in the openings 4 in the device areas of the first type 1 to form the N+ polysilicon landing plugs 32C contacting the N− contacts 17(N−) on the substrate. The polysilicon plugs to the N− substrate contacts 17 provide low leakage currents, such as is desirable for the memory cells on a DRAM chip, while the metal contacts to the N+ and P+ contacts on the substrate provide low contact resistance (Rc) as would be desirable in the peripheral areas of the DRAM chip for CMOS circuits.

The anisotropic etching is preferably carried out using an RIE and a sequence of etchant gases such as $CF_4$, $CHF_3$, $O_2$, and Ar for etching the $Si_3N_4$ 34, and an etchant gas such as $Cl_2$, $SF_6$, $O_2$, and Ar for etching the tungsten layer 32, the barrier layer 30, and the polysilicon layer 26.

Still referring to FIG. 9, a third $Si_3N_4$ layer is deposited and anisotropically etched back to form sidewall spacers 38 on the interconnecting lines 32A. The third $Si_3N_4$ layer is deposited to a thickness of between about 300 and 800 Angstroms.

Figure 10:
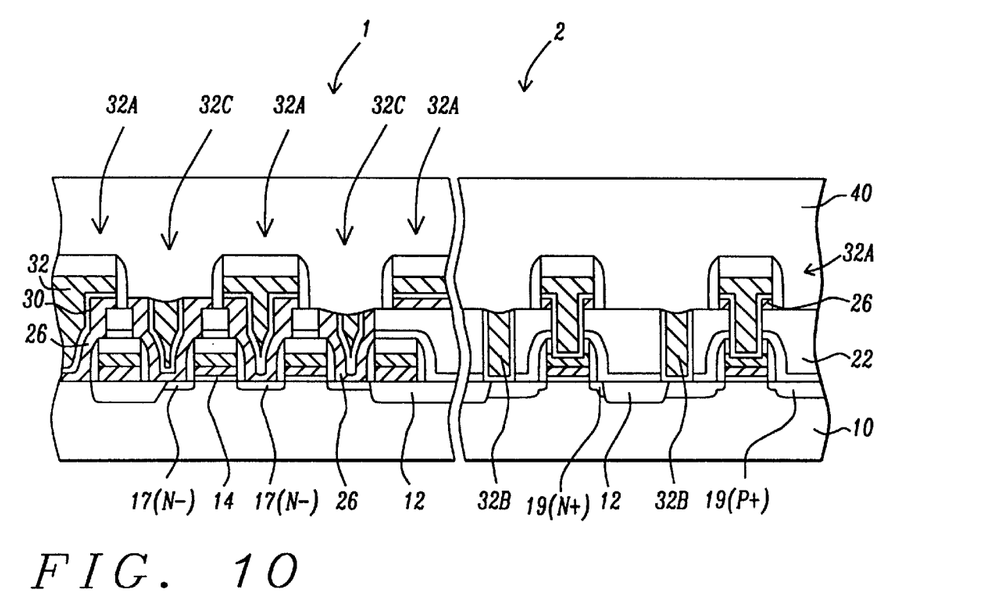

Referring to FIG. 10, a second insulating layer 40 is deposited and planarized. Layer 40 is preferably composed of a CVD $SiO_2$ or a doped $SiO_2$ such as borophosphosilicate glass (BPSG). Layer 40 is planarized preferably by chemical/mechanical polishing (CMP) to have a preferred thickness of between about 8000 and 12000 Angstroms over the interconnecting lines 32A.

Figure 11:
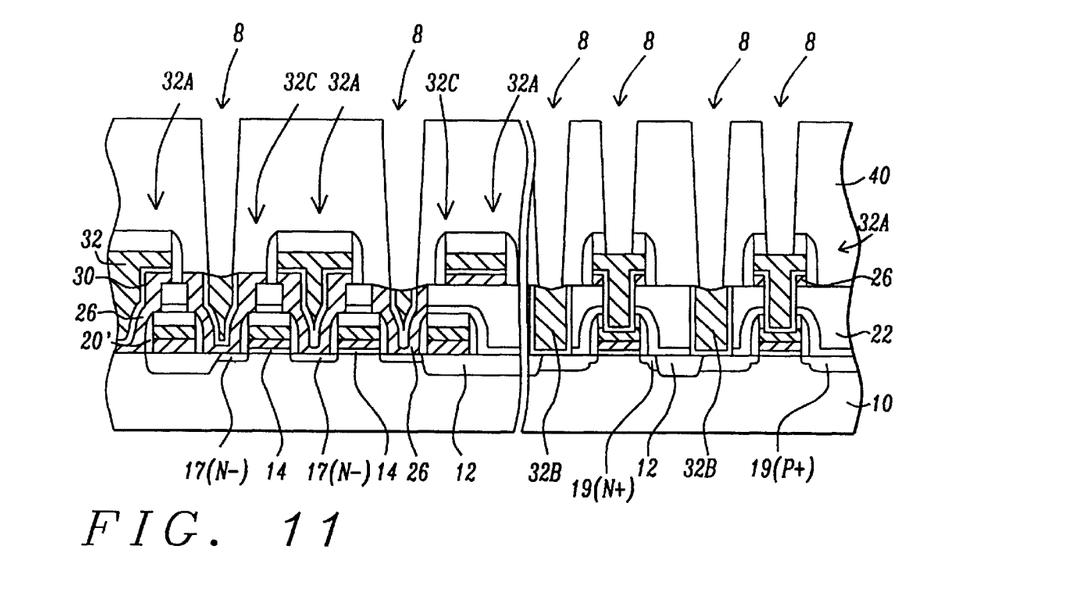

Referring to FIG. 11, multilevel contact holes (via holes) 8 are etched in the second insulating layer 40 to the polysilicon landing plugs 32C, to the tungsten metal landing plugs 32B, and to the interconnecting lines 32A. Photolithographic techniques and anisotropic plasma etching are used to etch the contact holes 8. For example, the etching can be carried out in an RIE using an etchant gas mixture containing fluorine, such as $C_5F_8$, $C_4F_8$, $CHF_3$, CO, $O_2$, and Ar. The self-aligned landing plugs 32B and 32C prevent overetching the contacts in the substrate and etching into the gate electrodes 16, as commonly occurs in the prior art and depicted in FIG. 1. Also, the self-aligned landing plugs reduce the aspect ratio for the via holes 8, thereby making it easier to etch submicron-wide via holes for future high-density circuit technologies.

Figure 12:
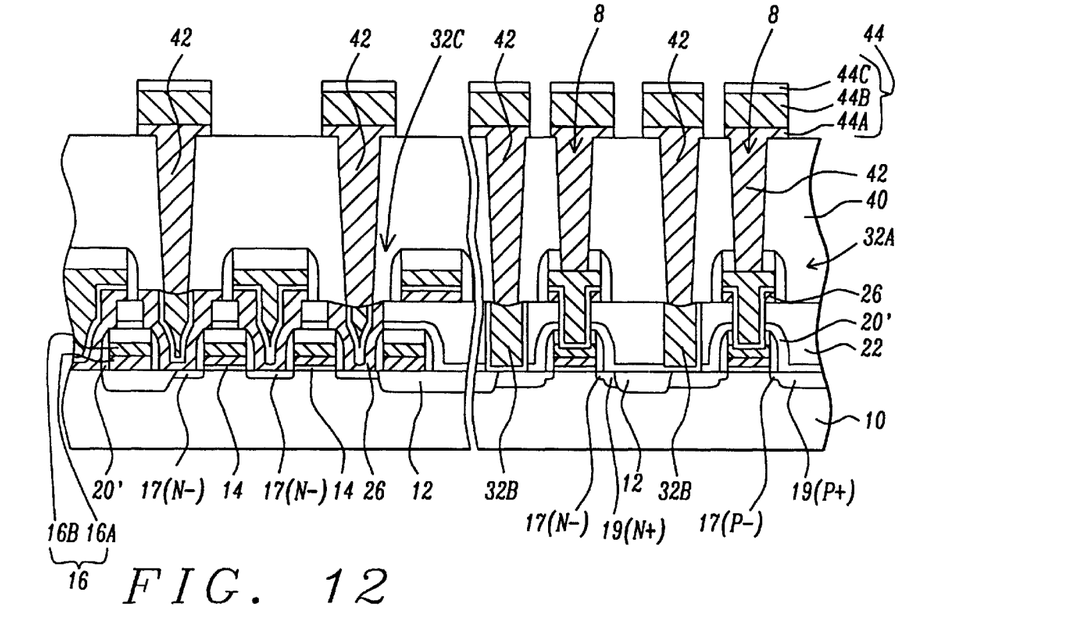

Referring to FIG. 12, the process for making the polysilicon and metal contact landing plugs with local interconnections is completed by depositing a second barrier layer, such as Ti/TiN and a second tungsten metal layer, which are blanket etched to form metal plugs 42 in the via holes 8 to the polysilicon landing plugs 32C, to the tungsten landing plugs 32B, and to the interconnecting lines 32A. The Ti/TiN second barrier layer is typically between about 100 and 600 Angstroms thick. A conducting metal multilayer 44, preferably composed of a titanium-titanium nitride layer 44A, an aluminum copper layer 44B, and a titanium nitride layer 44C is deposited and patterned to complete the integrated circuits up to a first level of metal interconnections. The Ti/TiN layer 44A is about 100 to 600 Angstroms thick. The AlCu layer 44B is about 4500 to 10000 Angstroms thick, and the TiN layer 44C is about 200 to 500 Angstroms thick. The multilayer 44 is then patterned by conventional photolithography and plasma etching to form the next level of electrical interconnections.

While the invention has been particularly shown and described with reference to the preferred embodiment thereof, it will be understood by those skilled in the art that various changes in form and details may be made without departing from the spirit and scope of the invention. Although the polysilicon and metal contact landing plug structure is depicted for an integrated circuit in general, it should be understood that the N+ polysilicon plugs to the N− contacts on the substrate can be used as node contacts for DRAM capacitors to reduce current leakage, and the metal contact landing plugs to the N+ and P+ contacts can be used in the peripheral circuits of the DRAM chip for CMOS devices to reduce Rc and to improve circuit performance.

What is claimed is:

1. Polysilicon landing plugs and metal landing plugs with electrical interconnections for contacts on semiconductor integrated circuits comprised of:

a semiconductor substrate having device areas of a first type and device areas of a second type, and having devices with N− doped contacts in said device areas of said first type, and having N+ and P+ doped contacts in said device areas of said second type;

a conformal first etch-stop layer partially etched back to form sidewall spacers on said devices and to protect said device areas of said first type and said device areas of said second type;

a planar insulating layer over said device areas;

said planar insulating layer and said etch-stop layer having first openings self-aligned to said devices and said first openings over and to said N− doped contacts in said device areas of said first type;

an N+ doped polysilicon layer on said planar insulating layer and in said first openings and contacting said N− contacts;

said N+ doped polysilicon layer, said planar insulating layer, and said first etch-stop layer having second openings to said N+ and P+ contacts in said device areas of said second type;

interconnecting lines formed from a barrier layer, a metal layer, and a second etch-stop layer and from said N+ doped polysilicon layer, and concurrently leaving said N+ doped polysilicon landing plugs in said device areas of said first type and leaving said metal layer in said N+ and said P+ contacts in said device areas of said second type to form said metal landing plugs.

2. The structure of claim 1, wherein said first etch-stop layer is silicon nitride layer and has a thickness of between about 200 and 600 Angstroms, and after said etching back has a thickness of between about 100 and 300 Angstroms over said device areas.

3. The structure of claim 1, wherein said planar insulating layer is silicon oxide and has a thickness of between about 1000 and 3000 Angstroms over said devices.

4. The structure of claim 1, wherein said barrier layer is a titanium layer and a titanium nitride layer.

5. The structure of claim 1, wherein said metal layer is tungsten.

* * * * *